United States Patent [19]

Yamaguchi et al.

[11] Patent Number: 5,107,524
[45] Date of Patent: Apr. 21, 1992

[54] SYNCHROTRON RADIATION UTILIZING APPARATUS AND METHOD FOR UTILIZING SYNCHROTRON RADIATION

[75] Inventors: Kiyoshi Yamaguchi, Mito; Masashi Kitamura, Hitachi; Naoki Maki, Ibaraki; Takashi Kobayashi, Hitachi, all of Japan

[73] Assignee: Hitachi, Ltd., Tokyo, Japan

[21] Appl. No.: 495,098

[22] Filed: Mar. 19, 1990

[30] Foreign Application Priority Data

Mar. 20, 1989 [JP] Japan .................................. 1-66221
Mar. 5, 1990 [JP] Japan .................................. 2-51691

[51] Int. Cl.$^5$ .............................................. G21K 5/00
[52] U.S. Cl. ...................................... 378/34; 378/69; 378/208
[58] Field of Search ..................... 378/34, 68, 69, 208

[56] References Cited

U.S. PATENT DOCUMENTS 4,028,547 6/1977 Eisenberger ......................... 378/34
4,029,967 6/1977 Tetzlaff .................................. 378/69
4,733,087 3/1988 Narita et al. ...................... 250/442.1

Primary Examiner—Craig E. Church
Attorney, Agent, or Firm—Antonelli, Terry, Stout & Kraus

[57] ABSTRACT

A synchrotron radiation utilizing apparatus comprises a generator generating synchrotron radiation, a guide duct for outwardly guiding the synchrotron radiation in a predetermined direction, a plurality of supporting members each supporting one of a plurality of objects which are targets to be irradiated with the synchrotron radiation, the supporting members being disposed at positions distant substantially by an equal distance from the center of rotation of the apparatus, a support base rotatably supporting the supporting members, a first rotating unit rotating each of the supporting members in a predetermined direction, a first control unit applying a control signal to the first rotating unit, a second rotating unit rotating the support base in the plane of the support base in a direction opposite to the direction of rotation of the object supporting members, and a second control unit applying a control signal to the second rotating unit.

18 Claims, 3 Drawing Sheets

SYNCHROTRON RADIATION UTILIZING APPARATUS AND METHOD FOR UTILIZING SYNCHROTRON RADIATION

BACKGROUND OF THE INVENTION

1. Field of the Invention

This invention relates to a synchrotron radiation utilizing apparatus and a method for utilizing synchrotron radiation. More particularly, this invention relates to an apparatus and a method as described above in which synchrotron radiation is utilized for the purpose of, for example, SOR lithography for manufacturing semiconductor devices.

2. Description of the Prior Art

Synchrotron radiation emitted from high energy electrons (charged particles) circulating in a beam duct of a synchrotron radiation generator (an electron accumulator ring) contains soft X-rays which have a wavelength as short as about 10 Å having good directivity and which have a high beam intensity. Therefore, the synchrotron radiation is noted as, for example, a lithography light source for manufacturing ultra LSI's of the next generation, and researches and studies for providing a synchrotron radiation generator apparatus of a small size are now being made. Apparatuses of this kind are disclosed in, for example, JP-A-63-175400 and JP-A-63-202900.

An X-ray exposure apparatus utilizing synchrotron radiation is disclosed in JP-A-62-291027. In this apparatus, synchrotron radiation radiated in an orbital plane is reflected to the outside of the orbital plane by the use of an oscillating reflection mirror thereby attaining the desired purpose of scanning.

On the other hand, an ion beam lithography apparatus disclosed in JP-A-62-5548 is known as an apparatus in which a wafer to be processed is revolved around the central axis of the apparatus while rotating around its own axis. The ion beam used in the known ion beam lithography apparatus is converged to meet the size of the wafer and is devoid of beam uniformity. In this known apparatus, the wafer is merely rotated around its own axis regardless of the period of its revolution around the central axis of the apparatus so that the entire wafer can be uniformly exposed to the ion beam.

In the prior art apparatus disclosed in JP-A-62-291027 cited above, a distance of about 5 m is required for reflecting and magnifying the soft X-rays, resulting in a large size of the apparatus. Further, because the synchrotron radiation is reflected by the reflected mirror, the synchrotron radiation tends to be attenuated, resulting in an inevitable decrease in the quantity of the radiation that can be used for the exposure. Also, in the prior art apparatus disclosed in JP-A-62-5548 cited above, it is only necessary to merely rotate the wafer around its own axis because the beam used for the lithography is the ion beam. The synchrotron radiation differs from the ion beam in that it is converged into a very small diameter. Thus, when the synchrotron radiation is used in lieu of the ion beam, it is necessary to very precisely scan the wafer for the purpose of uniform exposure.

SUMMARY OF THE INVENTION

With a view to solve the various prior art problems, it is an object of the present invention to provide a synchrotron radiation utilizing apparatus utilizing synchrotron radiation for uniform exposure of objects, in which a large area can be scanned without attenuation of the synchrotron radiation, so that the objects can be uniformly irradiated with the synchrotron radiation.

In an embodiment of the present invention which attains the above object, a plurality of objects which are targets to be irradiated with synchrotron radiation are mounted on a rotary support base having a perpendicular shaft in such a relation that the objects are arranged in an equally spaced relation along an imaginary circle drawn around the shaft, and the synchrotron radiation is directed toward the objects while rotating the support base. That is, according to one aspect of the present invention, there is provided a synchrotron radiation utilizing apparatus comprising means for generating synchrotron radiation, means for guiding the synchrotron radiation generated from the synchrotron radiation generating means in a predetermined direction, a plurality of supporting members each supporting one of a plurality of objects which are targets to be irradiated with the synchrotron radiation, the supporting members being disposed at positions distant substantially by an equal distance from the center of rotation of the apparatus, a support base rotatably supporting the object supporting members, first rotating means for rotating each of the object supporting members in a predetermined direction, first control means for applying a control signal to the first rotating means, second rotating means for rotating the support base in the plane of the support base in a direction opposite to the direction of rotation of the object supporting members, and second control means for applying a control signal to the second rotating means.

Suppose the case where the plural supporting members supporting the objects (for example, wafers of silicon, gallium arsenide, etc.) which are the targets to be irradiated with the synchrotron radiation are mounted on the support base having the perpendicular shaft in such a relation that the supporting members are arranged in an equally spaced relation on an imaginary circle drawn around the shaft, and the synchrotron radiation is directed toward the objects while rotating both the support base and the supporting members. The radiation intensity distribution in the above case will now be discussed. When each of the supporting members is rotated at an angular velocity w, the rotation velocity at a point spaced by a distance Y from the center of the support base is expressed as Yw. The spot of the synchrotron radiation on each of the objects lies on a line, and the synchrotron radiation sweeps the object with the rotation of the supporting member. However, as described above, the rotation velocity of the object increases in proportion to the distance from the rotary shaft of the support base. This means that the quantity of the synchrotron radiation irradiating a unit area of the object per unit time decreases in inverse proportion to the distance from the rotary shaft of the support base. Thus, in the exposure apparatus having the above arrangement, such an undesirable non-uniform radiation intensity distribution results in which the intensity distribution is high at a radially inner area of the object but low at a radially outer area of the object.

In the present invention which obviates such a disadvantage, means are provided so that the plural objects can be rotated at the angular velocity $\omega$ independently of each other in a direction opposite to the direction of rotation of the support base, so that the composite angular velocity becomes zero. Therefore, when the surface of the object is looked at from the position of an observer who stands still (for example, the operator of the exposure apparatus), the spot of the synchrotron radiation makes a substantially parallel movement on the surface of the object, so that the aforementioned problem of the non-uniform radiation intensity distribution attributable to the difference between the rotation velocities can be avoided.

The synchrotron radiation utilizing apparatus, especially the objects preferably maintained in an atmosphere of a reduced pressure. When the plural objects are maintained in such an atmosphere, the objects can be efficiently exposed to the synchrotron radiation within a short period of time, and a very fine circuit pattern can be uniformly formed on the object, so that the productivity of semiconductor devices can be greatly improved.

Applicable fields of the present invention include, besides that described above, analysis of trace elements or microelements using light absorption, determination of the arrangement of atoms of non-crystalline substances by measurement of spectral fine structures near absorption edges of an X-ray region, observation of lattice defects on the basis of diffraction spot images, analysis of the structure of macromolecules based on the small angle scattering method utilizing the parallelism of synchrotron orbital radiation (SOR), and measurement of distances between component atoms in alloys by the anomalous scattering method.

DESCRIPTION OF THE PREFERRED EMBODIMENTS

Figure 1:
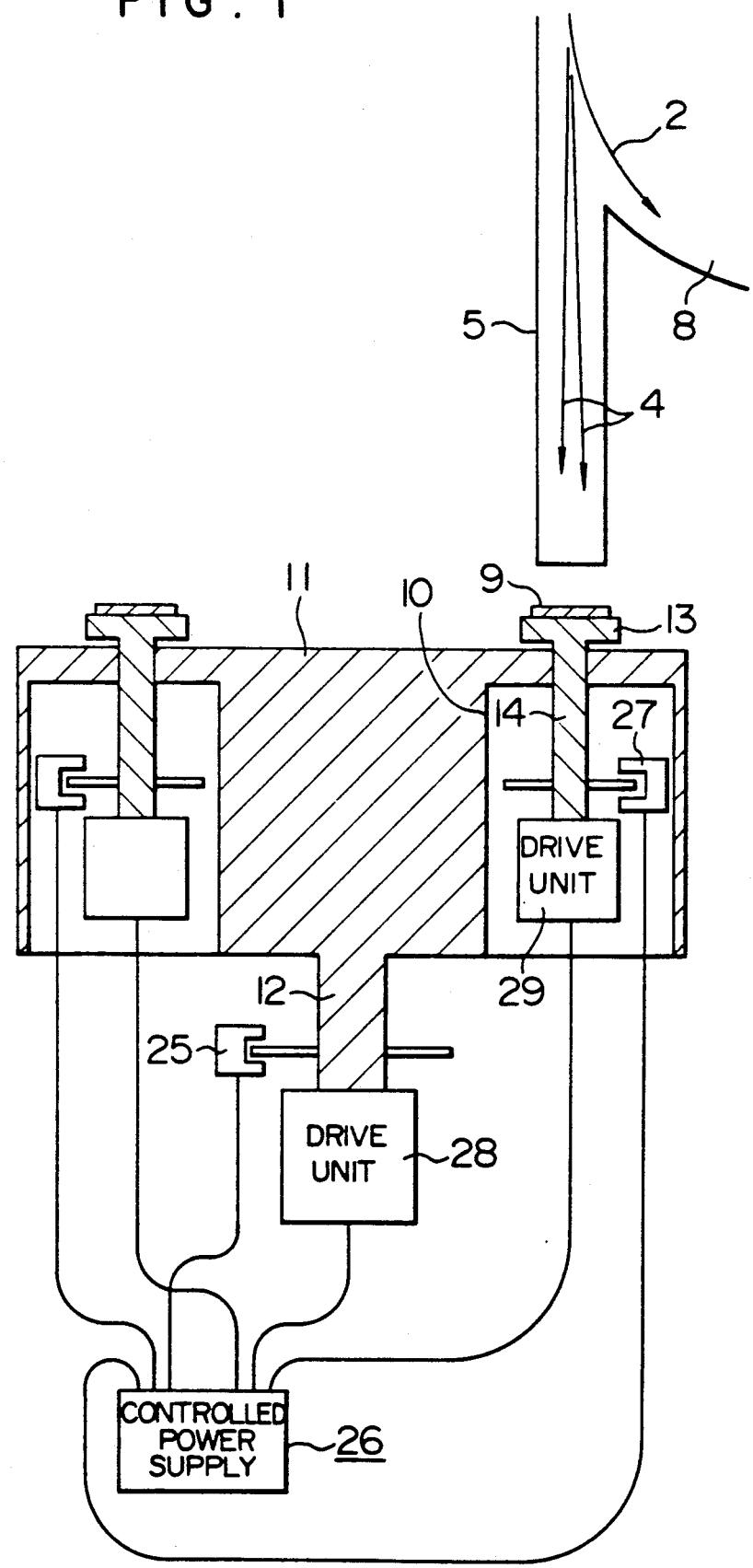
FIG. 1 shows schematically the general structure of an embodiment of the synchrotron radiation utilizing apparatus according to the present invention.

FIG. 1 shows a first embodiment of the synchrotron radiation utilizing apparatus according to the present invention.

Referring to FIG. 1, synchrotron radiation 4 emitted from an electron beam 2 circulating at a high velocity in an electron accumulation ring 8 of a synchrotron radiation generator (not shown) is radiated in a direction tangential with respect to the orbit of the electron beam 2. The synchrotron radiation 4 is guided by a beam duct 5 whose end is closed so as to maintain a vacuum thereinside. The synchrotron radiation guided through the beam duct 5 penetrates a window (made of a metal, for example, Be) provided at the closed end of the beam duct 5. Objects 9 which are targets to be exposed to the radiated synchrotron radiation 4 are fixedly mounted on supporting members 13 respectively, and these object supporting members 13 are disposed so as to be rotatable relative to a support base 11 supporting the object supporting members 13. Each of the object supporting members 13 is provided with an integral rotary shaft 14, and the support base 11 is combined with an integral rotary body 10 which is provided with an integral rotary shaft 12.

In the apparatus having the structure described above, the rotary body 10 is rotated by rotation of the rotary shaft 12, so that the objects 9 can be moved in a direction of 90° relative to the electron orbital plane while maintaining such an angular relation. Therefore, when the rotation velocity of the rotary body 10 is suitably selected, the synchrotron radiation 4 can be directed toward the entire surface of each of the objects 9 in a quantity suitable for exposure. Thus, the apparatus is suitable for semiconductor lithography in which accurate circuit patterning through a mask over a wide area of the objects 9 is especially required.

A rotation angle sensor 25 is associated with the rotary shaft 12, and its detection output signal is transmitted to a controlled power supply unit 26. A rotation angle sensor 27 is also associated with each of the rotary shafts 14, and its detection output signal is also transmitted to the controlled power supply unit 26. A rotation drive unit 28 is provided for the rotary shaft 12, and a rotation drive unit 29 is also provided for each of the rotary shafts 14. Controlled power is supplied from the controlled power supply unit 26 to the drive control units 28 and 29 so as to rotate the rotary shafts 12 and 14 at required angular velocities respectively. For example, the rotation drive units 28 and 29 are stepping motors, and the controlled power supply unit 26 supplies controlled power in pulse form. The operation of the drive units 28 and 29 is such that the rotary shafts 12 and 14 are rotated in directions opposite to each other at the same angular velocity. Thus, the object supporting members 13 do not rotate in the horizontal plane but merely make parallel movement in the horizontal plane. On the other hand, the synchrotron radiation 4 is directed to scan the objects 9 at a predetermined angle with respect to the horizontal plane (commonly in a relation parallel to the foundation). Therefore, the objects 9 fixedly mounted on the respective supporting members 13 are uniformly exposed to the synchrotron radiation 4.

Figure 2:
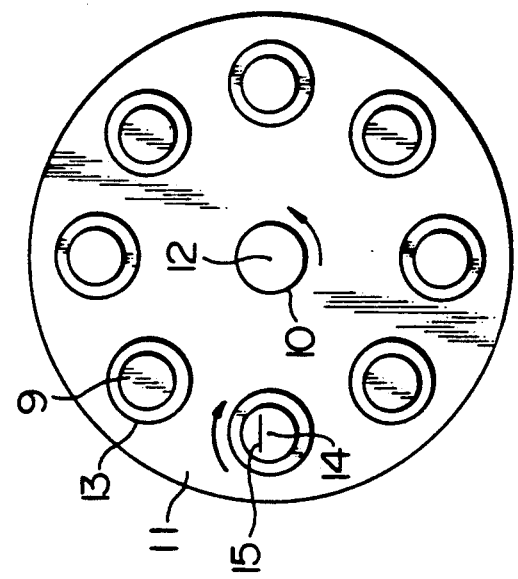
FIG. 2 is a schematic plan view of the apparatus to show how the objects to be exposed to the synchrotron radiation are mounted on the supporting members which are rotatable around their own axes respectively and are supported on the support base which is rotatable around its control axis.

FIG. 2 shows that the objects 9 to be exposed to the synchrotron radiation 4 are fixedly mounted on the supporting members 13 combined with their rotary shafts 14 respectively.

In FIG. 2, the supporting members 13 fixedly mounting the respective objects 9 thereon are thus revolvable relative to the support base 11. Because the object supporting members 13 revolve around the rotary shaft 12 of the support base 11, and the peripheral velocity of the area of the object supporting members 13 remote from the rotary shaft 12 of the support base 11 differs from that of the area near the shaft 12, the area of each of the objects 9 located near the shaft 12 is exposed to a greater quantity of the synchrotron radiation 4 than that of the area located remote from the shaft 12. For example, in the case of semiconductor lithography, the diameter of each wafer 9 is about 10 cm. Therefore, when the distance between the shaft 12 of the support base 11 and the center of each supporting member 13 supporting the wafer 9 is 25 cm, the velocity difference on the wafer 9 is calculated to be 33% at a maximum, as follows: The rotation velocity at a point on the wafer 9 is proportional to the distance between that point and the shaft 12 of the support base 11. Thus, the velocity difference between two points remotest from and nearest to the shaft 12 is expressed as follows:

$$1-(25-10/2)/(25+10/2)=0.33$$

However, when, in the arrangement shown in FIG. 2, the object 9 is rotated in one direction around the shaft 14 through the same angle as that of the revolution in the other direction around the shaft 12, the same angle is maintained between an imaginary line 15 drawn on the object 9 and the orbital plane of the electrons. Because the rotation velocity of the object 9 is maintained constant, the exposure quantity of the synchrotron radiation 4 on the object 9 can be maintained constant regardless of the position and time.

Further, the synchrotron radiation 4 is very finely converged so that it can accurately scan all over the wafer 9 to ensure uniform exposure. Therefore, while revolving the wafer supporting member 13 around the shaft 12 of the support base 11, the wafer supporting member 13 is rotated around its own shaft 14 in a direction opposite to the revolving direction and at the same angular velocity as that in the revolving movement, so that undesirable non-uniform exposure may not result from the tangential velocity difference between the radially inner and outer areas of the wafer 9 due to the revolution of the wafer supporting member 13 around the shaft 12 of the support base 11.

Figure 3:
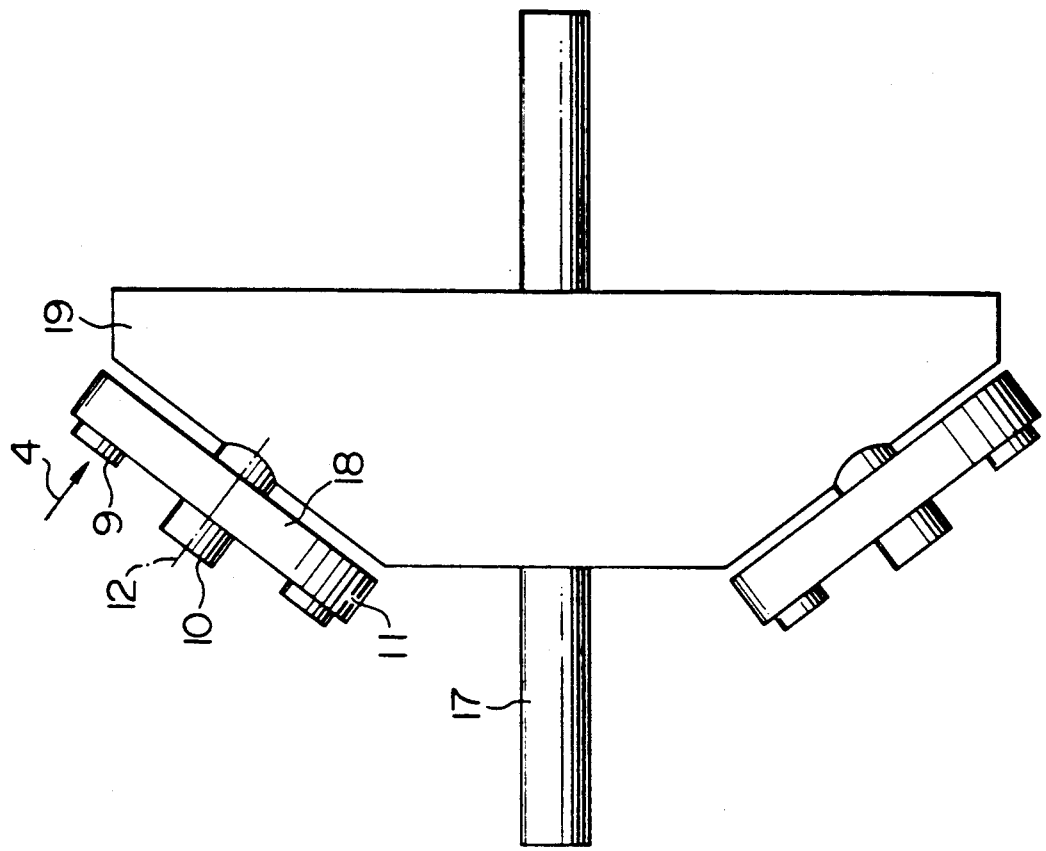
FIG. 3 is a schematic side elevational view of another embodiment of the present invention in which object mounting jigs, each of which is formed by object supporting members and a support base, are supported on a frusto-conical block whose rotary shaft does not extend in parallel to the direction of synchrotron radiation.

FIG. 3 shows a second embodiment of the present invention, and in FIG. 3, like reference numerals are used to designate like parts appearing in FIG. 1.

Referring to FIG. 3, a support block 19 in the form of a frustum of a right cone is mounted at its central axis on a rotary shaft 17. A plurality of object mounting jigs 18 each including a support base 11 and a rotary shaft 10 are perpendicularly mounted on the side surface of the frusto-conical support block 19, and each of the object mounting jigs 18 is rotatable around the axis 12 of the rotary shaft 10. In the apparatus shown in FIG. 3, the combination of the support block 19 and the rotary shaft 10 acts to successively feed the object mounting jigs 18 to a predetermined exposure position, and, when each object mounting jig 18 is fed to the predetermined exposure position, the jig 18 is rotated around the axis 12 of the rotary shaft 10, so that objects 9 can be successively exposed to synchrotron radiation 4. In this case, objects 9 mounted on any one of the object mounting jigs 18 not located at the predetermined exposure position can be replaced as desired. In the apparatus shown in FIG. 3, the side surface of the support block 19 mounted on the rotary shaft 17 is inclined relative to the direction of the synchrotron radiation 4 by an angle equal to the vertical angle of the cone. Therefore, the rotary shaft 17 need not be disposed in parallel to a beam duct 5, and this is desirable from the viewpoint of design in that there is an increased freedom for the layout of the exposure apparatus.

Figure 4:
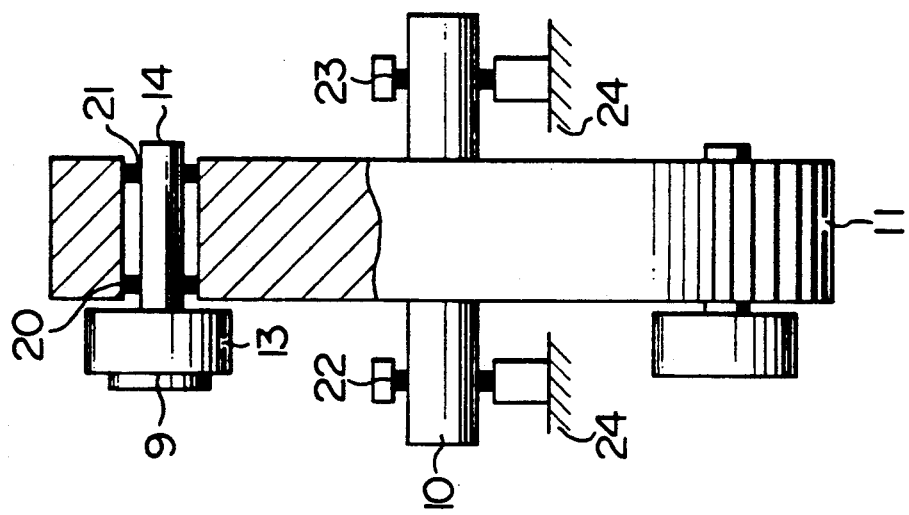
FIG. 4 is a partly sectional, schematic side elevational view of the object mounting jig shown in FIG. 3 to illustrate how the support base and object supporting members tend to incline due to clearances between their rotary shafts and bearings in which the shafts are journalled.

FIG. 4 is a partly sectional side elevational view of the support base 11 shown in FIG. 3 to illustrate how the support base 11 and object supporting members 13 are mounted on their rotary shafts.

Referring to FIG. 4, the rotary shaft 10 supporting the support base 11 is rotatably journalled in two bearings 22 and 23, while each of the rotary shafts 14 supporting the object supporting members 13 is rotatably journalled in two bearings 20 and 21. When each of the bearings 20, 21, 22 and 23 has the same clearance of 12.5 μm between it and the associated shaft, and the distance between the bearings 20 and 21 and that between the bearings 22 and 23 are more than 10 cm, the ratio between the clearance of the bearings and the distance between the bearings is less than 1/8000. A paper (reported in Applied Physics, Vol. 53, No. 1, 1984, pp. 17-25) describes that, in the case of lithography in which the line width is 0.5 μm, and the spacing between masks and wafers is 20 μm, the dimensional error is to be less than 0.01 μm. when the ratio between the clearance of the bearings and the distance between the bearings is 1/8000 as described above, a maximum inclination of $1/4000=2.5 \times 10^{-6}$ radians is caused due to the clearances of the left and right two bearings. This angle produces, together with the spacing of 20 μm between the masks and the wafers, an error which is calculated as $20 \mu m \times 2.5 \times 10^{-6} = 0.005 \mu m$. This error may be $0.005 \times 2 = 0.01 \mu m$ even when all the clearances of the bearings 20, 21, 22 and 23 are combined.

The ratio between the clearance of the bearings and the distance between the bearings can be decreased to less than 1/8000 by employing, for example, angular ball bearings and selecting the distance between the bearings to be more than 10 cm. In this case, the clearance of the angular ball bearings is to be selected to be less than 12.5 μm. In the synchrotron radiation utilizing apparatus of the present invention, the rotary shafts are expected to be rotated at a very low speed lower than one revolution per minute. Therefore, the clearance of the angular ball bearings can be easily set at a value less than 12.5 μm. Even when the clearance of the angular ball bearings cannot be set to be less than 12.5 μm, the distance between the bearings can be easily set at a value more than 10 cm. Displacement of the objects 9 caused by the clearance of the bearings may be parallel movement, besides that attributable to the inclination described above. However, such parallel movement will hardly occur in view of the very low rotation speed of the rotary shafts in the apparatus. Even when such parallel movement may occur, it does not pose any practical problem. This distant is because light emitted from a point light source distant by 5 m from an object makes a very small angle of $12.5 \times 10^{-6}/5 = 2.5 \times 10^{-6}$ radians with the object making parallel movement of $12.5 \mu m = 12.5 \times 10^{-6}$ m.

Figure 5:
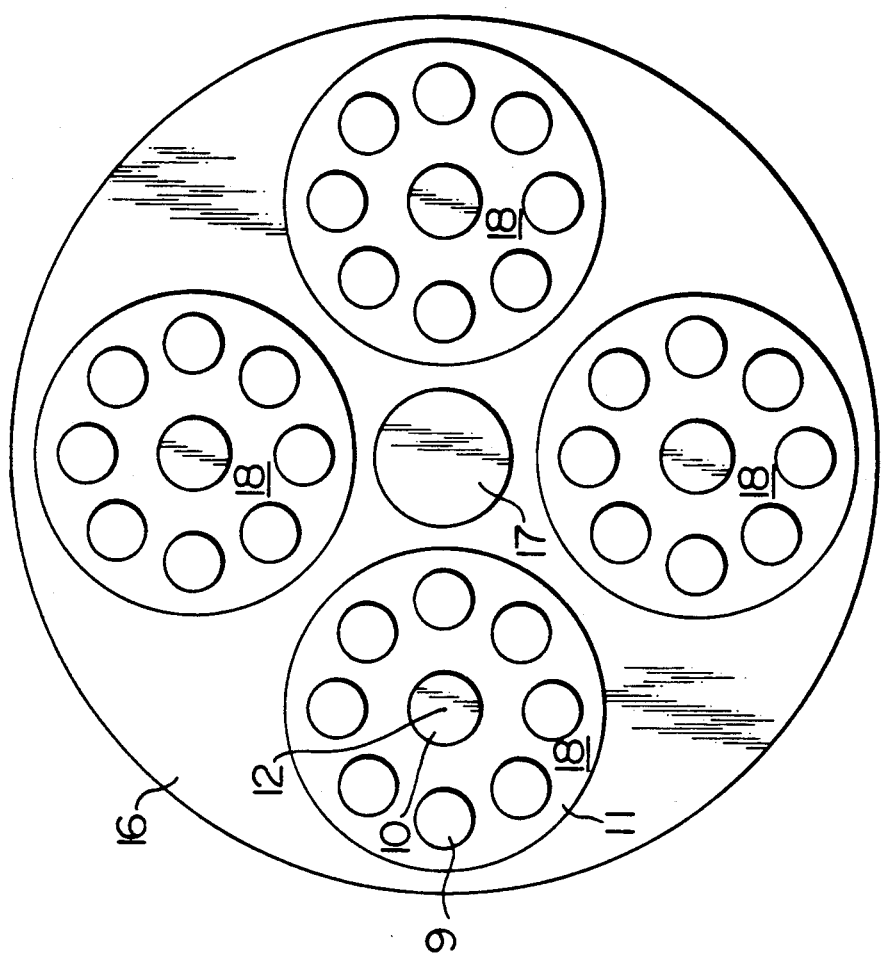
FIG. 5 is a schematic plan view of still another embodiment of the present invention in which object mounting jigs, each of which is formed by object supporting members and a support base, are mounted on a largediameter disc so as to be rotatable around the central axis of the disc.

FIG. 5 shows a third embodiment of the present invention, and, in FIG. 5, like reference numerals are used to designate like parts appearing in FIGS. 1 and 3.

Referring to FIG. 5, a large-diameter support disc 16 is mounted on a rotary shaft 17 at its central axis. A plurality of object mounting jigs 18 each including a support base 11 and a rotary shaft 10 are mounted on the support disc 16, so that each object mounting jig 18 is rotatable around the axis 12 of the rotary shaft 10 relative to the support disc 16. In the apparatus shown in FIG. 5, the combination of the support disc 16 and the rotary shaft 17 acts to successively feed the object mounting jigs 18 to a predetermined exposure position, and, when each object mounting jig 18 is fed to the predetermined position, the jig 18 is rotated around the axis 12 of the rotary shaft 10, so that objects 9 can be successively exposed to synchrotron radiation. In this case, objects 9 mounted on any one of the object mounting jigs 18 not located at the predetermined exposure position can be replaced as desired. Therefore, the desired replacement operation can be continued without discontinuing the exposure of the objects.

It will be understood from the foregoing detailed description of the present invention that a plurality of objects can be efficiently exposed to synchrotron radiation within a short period of time, and a very fine circuit pattern can be uniformly formed on the objects, so that the productivity of semiconductor devices can be greatly improved.

We claim:

1. A synchrotron radiation utilizing apparatus comprising:
   means for generating synchrotron radiation;
   means for outwardly guiding said synchrotron radiation generated from said synchrotron radiation generating means in a predetermined direction;
   a plurality of supporting members each supporting one of a plurality of objects which are targets to be irradiated with said synchrotron radiation, said supporting members being disposed at positions distant substantially by an equal distance from a center of rotation of said apparatus;
   a support base supporting said object supporting members;
   first rotating means for rotating each of said objects in a predetermined direction in a plane of said supporting members;
   first control means for applying a control signal to said first rotating means;
   second rotating means for rotating said support base in a plane of said support base in a direction opposite to the direction of rotation of said objects; and
   second control means for applying a control signal to said second rotating means;
   wherein a plurality of obbject mounting jigs each including the combination of said support base and said object supporting members are mounted on the side surface of a block in the form of a frustum of a right cone mounted on a rotary shaft, and each of said object mounting jigs is rotatable around a shaft extending in perpendicular relation to the side surface of said block.

2. A synchrotron radiation utilizing apparatus according to claim 1, wherein a vertical angle of said frusto-conical block mounted at its central axis on said rotary shaft ranges between 0° and 90°.

3. A synchrotron radiation utilizing apparatus according to claim 2, wherein a rotary shaft of said support base and a rotary shaft of each of said object supporting members are rotatably journalled in two bearings and two bearings respectively, and the ratio of the clearance between said rotary shaft and each of said bearings to the distance between said two bearings is selected to be less than 1/8000.

4. An apparatus for holding targets to be processed comprising:
   a plurality of supporting members each supporting one of a plurality of objects which are targets to be irradiated with synchrotron radiation, said supporting members being disposed at positions distant substantially by an equal distance from a center of rotation of said apparatus;
   a support base supporting said object supporting members;
   first rotating means for rotating each of said objects in a predetermined direction in a plane of said object supporting members;
   first control means for applying a control signal to said first rotating means;
   second rotating means for rotating said support base in a plane of said support base in a direction opposite to the direction of rotation of said objects; and
   second control means for applying a control signal to said second rotating means;
   wherein said first rotating means rotates each of said objects in the predetermined direction at a predetermined angular velocity, and wherein said second rotating means rotates said support base in the direction opposite to the direction of rotation of said objects at the same angular velocity at which said objects are rotated such that a composite angular velocity of each of said objects is zero.

5. A synchrotron radiation utilizing apparatus comprising a charged particle beam duct forming a vacuum chamber required for circulation of a charged particle beam, at least one synchrotron radiation guide duct disposed outside relative to said charged particle beam duct for outwardly guiding synchrotron radiation discharged when the charged particle beam is deflected by a magnetic field, means disposed adjacent to the outlet of said synchrotron radiation guide duct and including a rotary shaft, a support base mounted on said rotary shaft and a plurality of rotatable supporting members each supporting one of a plurality of objects disposed substantially along a circle on said support base, means for rotating said object supporting members, and means for rotating said support base in a direction opposite to the direction of rotation of said object supporting members, whereby said objects are directly irradiated with said synchrotron radiation from said synchrotron radiation guide duct while under rotation.

6. A synchrotron radiation utilizing apparatus according to claim 5, wherein said means for rotating said object supporting members rotates said object supporting members at a predetermined angular velocity, and wherein said means for rotating said support base rotate said support base in the direction opposite too the direction of rotation of said object supporting members at the same angular velocity at which said object supporting members are rotated such that a composite angular velocity of each of said object rotating members is zero.

7. A method for utilizing synchrotron radiation comprising the steps of:
   outwardly guiding synchrotron radiation generated from synchrotron radiation generating means in a predetermined direction;
   supporting a plurality of objects, which are targets to be irradiated with said synchrotron radiation, on a plurality of supporting members, said supporting members being rotatably supported on a support base and disposed at positions distant substantially by an equal distance from a center of rotation of said support base;
   rotating each of said object supporting members in a predetermined direction while, at the same time, rotating said support base in a plane of said support base in a direction opposite to the direction of rotation of said object supporting members; and controlling rotating means rotating said support base and rotating means rotating said object supporting members so that a spot of said synchrotron radiation irradiating each of said objects describes a rectilinear locus.

8. A method for utilizing synchrotron radiation according to claim 7, wherein when one object on one of said obbject supporting members is being irradiated with said synchrotron radiation while rotating said one object supporting member, another object on another of said object supporting members is being replaced.

9. A method for utilizing synchrotron radiation according to claim 7, wherein each of said object supporting members is rotated in the predetermined direction at a predetermined angular velocity, and wherein said support base is rotated in the direction opposite to the direction of rotation of said object supporting members at the same angular velocity at which said object supporting members are rotated such that a composite angular velocity of each of said object supporting members is zero.

10. A synchrotron radiation utilizing apparatus comprising a charged particle beam duct forming a vacuum chamber required for circulation of a charged particle beam, at least one synchrotron radiation guide duct disposed outside relative to said charged particle beam duct for outwardly guiding synchrotron radiation discharged when the charged particle beam is deflected by a magnetic field, a plurality of objects which are targets to be irradiated with said synchrotron radiation and disposed substantially along a circle on a support base in the vicinity f the outlet of said synchrotron radiation guide duct, each of said objects being supported on a rotatable supporting member, means for rotating said object supporting members, and means for rotating said support base in a direction opposite to the direction of rotation of said object supporting members, whereby said objects are directly irradiated with said synchrotron radiation from said synchrotron radiation guide duct while under rotation.

11. A synchrotron radiation utilizing apparatus according to claim 10, wherein said means for rotating said object supporting members rotates said object supporting members at a predetermined angular velocity, and wherein said means for rotating said support base rotates said support base in the direction opposite to the direction of rotation of said object supporting members at the same angular velocity at which said object supporting members are rotated such that a composite angular velocity of each of said object supporting members is zero.

12. A synchrotron radiation utilizing apparatus comprising:

means for generating synchrotron radiation;

means for outwardly guiding said synchrotron radiation generated from said synchrotron radiation generating means in a predetermined direction;

a plurality of supporting members each supporting one of a plurality of objects which are targets to be irradiated with said synchrotron radiation, said supporting members being disposed at positions distant substantially by an equal distance from a center of rotating of said apparatus;

a support base rotatably supporting said object supporting members;

first rotating means for rotating said object supporting members independently of each other in a predetermined direction and at a predetermined angular velocity;

first control means for applying a control signal to said first rotating means;

second rotating means for rotating said support base in a plane of said support base in a direction opposite to the direction of rotation of said object supporting members and at the same angular velocity at which said object supporting members are rotated such that a composite angular velocity of each of said objects is zero and such that a spot of said synchrotron radiation makes a substantially parallel movement on a surface of each of said objects relative to a stationary observer, thereby obviating a non-uniform radiation intensity distribution of said synchrotron radiation on said surface attributable to a difference in rotation velocities of points on said surface radially spaced relative to said center of rotation; and second control means for applying a control signal to said second rotating means.

13. A synchrotron radiation utilizing apparatus comprising:

means for generating synchrotron radiation;

means for outwardly guiding said synchrotron radiation generated from said synchrotron radiation generating means in a predetermined direction;

a plurality of supporting members each supporting one of a plurality of objects which are targets to be irradiated with said synchrotron radiation, said supporting members being disposed at positions distant substantially by an equal distance from a center of rotation of said apparatus;

a support base rotatably supporting said object supporting members;

first rotating means for rotating said object supporting members independently of each other in a predetermined direction and at a predetermined angular velocity;

first control means for applying a control signal to said first rotating means;

second rotating means for rotating said support base in a plane of said support base in a direction opposite to the direction of rotation of said object supporting members and at the same angular velocity at which said object supporting members are rotated such that a composite angular velocity of each of said objects is zero and such that a spot of said synchrotron radiation makes a substantially parallel movement on a surface of each of said objects relative too a stationary observer, thereby obviating a non-uniform radiation intensity distribution of said synchrotron radiation on said surface attributable to a difference in rotation velocities of points on said surface radially spaced relative to said center of rotation;

second control means for applying a control signal to said second rotating means;

first rotation angle sensor means for detecting the rotation of each of said object supporting members;

means for applying a control signal to said first control means on the basis of the detection output signal from said first rotation angle sensor means;

second rotation angle sensor means for detecting the rotation of said support base;

means for applying a control signal to said second control means on the basis of the detection output signal from said second rotation angle sensor means; and controlled power supply means including said first and second control means for controlling the angular velocity of rotation of said support base relative to that of said object supporting members, so that said support base and said object supporting members are rotated in directions opposite to each other at the same angular velocity.

14. A synchrotron radiation utilizing apparatus comprising:

means for generating synchrotron radiation;

means for outwardly guiding said synchrotron radiation generated from said synchrotron radiation generating means in a predetermined direction;

a plurality of supporting members each supporting one of a plurality of objects which are targets to be irradiated with said synchrotron radiation, said supporting members being disposed at positions distant substantially by an equal distance from a center of rotation of said apparatus;

a support base rotatably supporting said object supporting members;

first rotating means for rotating said object supporting members independently of each other in a predetermined direction and at a predetermined angular velocity;

first control means for applying a control signal to said first rotating means;

second rotating means for rotating said support base in a plane of said support base in a direction opposite to the direction of rotation of said object supporting members and at the same angular velocity at which said object supporting members are rotated such that a composite angular velocity of each of said objects is zero and such that a spot of said synchrotron radiation makes a substantially parallel movement on a surface of each of said objects relative to a stationary observer, thereby obviating a non-uniform radiation intensity distribution of said synchrotron radiation on said surface attributable to a difference in rotation velocities of points on said surface radially spaced relative to said center of rotation; and second control means for applying a control signal to said second rotating means;

wherein a plurality of object mounting jigs each including the combination of said support base and said object supporting members are mounted on the side surface of a block in the form of a frustum of a right cone mounted on a rotary shaft, and each of said object mounting jigs is rotatable around a shaft extending in perpendicular relation to the side surface of said block.

15. A synchrotron radiation utilizing apparatus according to claim 14, wherein a vertical angle of said frusto-conical block mounted at its central axis on said rotary shaft ranges between 0° and 90°.

16. A synchrotron radiation utilizing apparatus according to claim 15, wherein a rotary shaft of said support base and a rotary shaft of each of said object supporting members are rotatably journalled in two bearings and two bearings respectively, and the ratio of the clearance between said rotary shaft and each of said bearings to the distance between said two bearings is selected to be less than 1/8000.

17. An apparatus for holding targets to be processed comprising:

a plurality of supporting members each supporting one of a plurality of objects which are targets to be irradiated with synchrotron radiation, said supporting members being disposed at positions distant substantially by an equal distance from a center of rotation of said apparatus;

a support base rotatably supporting said object supporting members;

first rotating means for rotating each of said object supporting members in a predetermined direction;

first control means for applying a control signal to said first rotating means;

second rotating means for rotating said support base in a direction opposite to the direction of rotation of said object supporting members; and second control means for applying a control signal to said second rotating means;

wherein said first rotating means rotates each of said object supporting members in the predetermined direction at a predetermined angular velocity, and wherein said second rotating means rotates said support base in the direction opposite to the direction of rotation of said object supporting members at the same angular velocity at which said object supporting members are rotated such that a composite angular velocity of each of said object supporting members is zero.

18. A synchrotron radiation utilizing apparatus comprising:

means for generating synchrotron radiation;

means for outwardly guiding said synchrotron radiation generated from said synchrotron radiation generating means in a predetermined direction;

a plurality of supporting members each supporting one of a plurality of objects which are targets to be irradiated with said synchrotron radiation, said supporting members being disposed at positions distant substantially by an equal distance from a center of rotation of said apparatus;

a support base supporting said object supporting members;

first rotating means for rotating each of said objects in a predetermined direction in a plane of said supporting members;

first control means for applying a control signal to said first rotating means;

second rotating means for rotating said support base in a plane of said support base in a direction opposite to the direction of rotation of said objects; and second control means for applying a control signal to said second rotating means;

wherein said first rotating means rotates each of said objects in the predetermined direction at a predetermined angular velocity, and wherein said second rotating means rotates said support base in the direction opposite to the direction of rotation of said objects at the same angular velocity at which said objects are rotated such that a composite angular velocity of each of said objects is zero.

* * * * *